(12) United States Patent
Giannazzo et al.

(10) Patent No.: US 12,426,285 B2
(45) Date of Patent: Sep. 23, 2025

(54) CONTEXTUAL FORMATION OF A JUNCTION BARRIER DIODE AND A SCHOTTKY DIODE IN A MPS DEVICE BASED ON SILICON CARBIDE, AND MPS DEVICE

(71) Applicant: STMICROELECTRONICS S.r.l., Agrate Brianza (IT)

(72) Inventors: Filippo Giannazzo, Catania (IT); Giuseppe Greco, Misterbianco (IT); Fabrizio Roccaforte, Mascalucia (IT); Simone Rascuna', Catania (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 538 days.

(21) Appl. No.: 17/939,842

(22) Filed: Sep. 7, 2022

(65) Prior Publication Data
US 2023/0087112 A1 Mar. 23, 2023

(30) Foreign Application Priority Data
Sep. 20, 2021 (IT) .......................... 102021000024104

(51) Int. Cl.
*H01L 21/04* (2006.01)
*H10D 8/01* (2025.01)
(Continued)

(52) U.S. Cl.
CPC ........... *H10D 8/051* (2025.01); *H01L 21/046* (2013.01); *H01L 21/0485* (2013.01); *H10D 8/50* (2025.01);
(Continued)

(58) Field of Classification Search
CPC . H10D 8/50; H10D 8/60; H10D 8/051; H01L 21/046
See application file for complete search history.

(56) References Cited

U.S. PATENT DOCUMENTS

| 10,840,385 B1 | 11/2020 | Sundaresan et al. |
| 2018/0190651 A1 | 7/2018 | Siemieniec et al. |
| 2019/0140111 A1* | 5/2019 | Konrath ................. H10D 8/051 |

FOREIGN PATENT DOCUMENTS

| CN | 108231871 A | 6/2018 |
| CN | 109686797 A | 4/2019 |

(Continued)

OTHER PUBLICATIONS

Rai, Progress in Contact, Doping and Mobility Engineering of MoS2: An atomically Thin 2D Semiconductor, 2018, MDPI, Crystals (Year: 2018).*

(Continued)

*Primary Examiner* — William B Partridge
*Assistant Examiner* — Emily Nicole Farmer
(74) *Attorney, Agent, or Firm* — Seed Intellectual Property Law Group LLP (57) ABSTRACT

Merged-PiN-Schottky, MPS, device comprising: a solid body having a first electrical conductivity; an implanted region extending into the solid body facing a front side of the solid body, having a second electrical conductivity opposite to the first electrical conductivity; and a semiconductor layer extending on the front side, of a material which is a transition metal dichalcogenide, TMD. A first region of the semiconductor layer has the second electrical conductivity and extends in electrical contact with the implanted region, and a second region of the semiconductor layer has the first electrical conductivity and extends adjacent to the first region and in electrical contact with a respective surface portion of the front side having the first electrical conductivity.

21 Claims, 8 Drawing Sheets

(51) Int. Cl.
  H10D 8/50     (2025.01)
  H10D 8/60     (2025.01)
  H10D 62/832   (2025.01)
  H10D 64/62    (2025.01)
  H10D 62/85    (2025.01)

(52) U.S. Cl.
  CPC .......... H10D 8/60 (2025.01); H10D 62/8325 (2025.01); H10D 64/62 (2025.01); *H10D 62/8503* (2025.01)

(56) References Cited

FOREIGN PATENT DOCUMENTS

| JP | 2011071281 A | * | 4/2011 | ........... H01L 29/872 |
|---|---|---|---|---|
| KR | 20190012891 A | | 2/2019 | |

OTHER PUBLICATIONS

Brosselard et al., "Bipolar Conduction Impact on Electrical Characteristics and Reliability of 1.2- and 3.5-kV 4H-SiC JBS Diodes" *IEEE Transactions on Electron Devices,* (55)8, 1847-1856, Aug. 2008.

Yang et al., "Epitaxial Molybdenum Disulfide/Gallium Nitride Junctions: Low-Knee-Voltage Schottky-Diode Behavior at Optimized Interfaces" *ACS Appl. Mater. Interfaces,* (13)29, 35105-35112, 2021.

Rai et al., "Progress in Contact, Doping and Mobility Engineering of MoS2: An Atomically Thin 2D Semiconductor" *Crystals,* (8)316, 84 pages, Aug. 2018.

Lee et al., "Growth and electrical characterization of two-dimensional layered MoS2/SiC heterojunctions" *Appl. Phys. Lett.* (105)203504, 5 pages, Nov. 2014.

Giannazzo et al., Ambipolar MoS2 Transistors by Nanoscale Tailoring of Schottky Barrier Using Oxygen Plasma Functionalization, *ACS Appl. Mater. Interfaces,* 9, 23164-23174, Jun. 2017.

Ghasemi et al., "Controlled Plasma Thinning of Bulk MoS2 Flakes for Photodetector Fabrication" *ACS Omega,* 4, 19693-19704, Nov. 2019.

Bosi, "Growth and synthesis of mono and few-layers transition metal dichalcogenides by vapour techniques: a review" *RSC Adv.* 5, 75500-75518, Aug. 2015.

Mouloua et al., "Recent Progress in the Synthesis of MoS2 Thin Films for Sensing, Photovoltaic and Plasmonic Applications: A Review" *Materials,* 14, 3283, 27 pages, Jun. 2021.

Islam et al., "Electrical property tuning via defect engineering of single layer MoS2 by oxygen plasma" *Nanoscale,* 6, 10033, 2014.

Khondaker et al., "Bandgap Engineering of MoS2 Flakes via Oxygen Plasma: A Layer Dependent Study" *J. Phys. Chem C,* 120, 13801-13806, Jun. 2016.

* cited by examiner

CONTEXTUAL FORMATION OF A JUNCTION BARRIER DIODE AND A SCHOTTKY DIODE IN A MPS DEVICE BASED ON SILICON CARBIDE, AND MPS DEVICE

BACKGROUND

Technical Field

The present disclosure relates to a method of manufacturing a MPS (Merged-PiN-Schottky) device, and a MPS device. In particular, a SiC-based device will be discussed.

Description of the Related Art

As is known, semiconductor materials, which have a wide band gap, in particular, which have an energy value Eg of the band gap being greater than 1.1 eV, low on-state resistance ($R_{ON}$), high value of thermal conductivity, high operating frequency and high saturation velocity of charge carriers, are ideal for producing electronic components, such as diodes or transistors, in particular for power applications. A material having said characteristics, and designed to be used for manufacturing electronic components, is silicon carbide (SiC). In particular, silicon carbide, in its different polytypes (for example, 3C—SiC, 4H—SiC, 6H—SiC), is preferable to silicon as regards the previously listed properties.

Electronic devices provided on a silicon-carbide substrate, as compared to similar devices provided on a silicon substrate, have numerous advantages, such as low output resistance in conduction, low leakage current, high working temperature, and high operating frequencies. In particular, SiC Schottky diodes have demonstrated higher switching performance, making SiC electronic devices particularly favorable for high frequency applications. Current applications impose requirements on electrical properties and also on long-term reliability of devices.

BRIEF SUMMARY

The present disclosure provides an electronic device and a method of manufacturing the electronic device.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

The present disclosure will be described with reference to a Merged-PiN-Schottky, MPS, device, based on SiC; however, as will be evident from the following description, the present disclosure is generally applied to MPS devices based on different types of semiconductors, for example, GaN.

Figure 1:
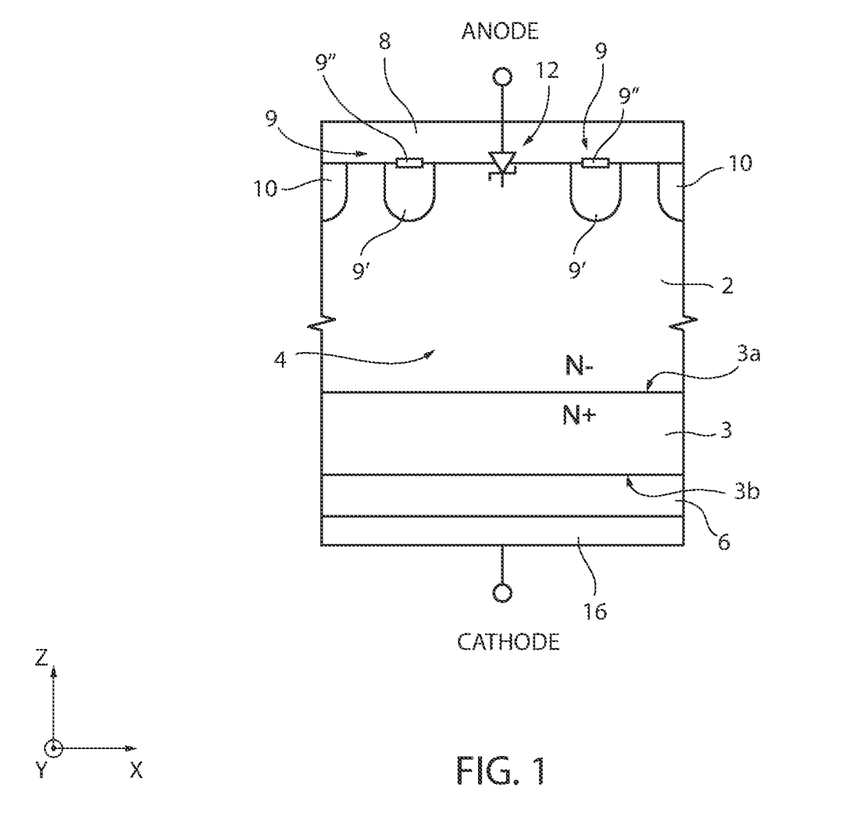
FIG. 1 shows, in cross-sectional view, a MPS device according to a known embodiment.

FIG. 1 shows, in lateral cross-section view in a Cartesian (triaxial) reference system of axes X, Y, Z, a MPS device 1.

The MPS device 1 includes: a substrate 3, of N-type SiC, having a first dopant concentration, provided with a surface 3a opposite to a surface 3b, and thickness equal to about 350 µm; a drift layer (grown in an epitaxial manner) 2, of N-type SiC, having a second dopant concentration being lower than the first dopant concentration, which extends on the surface 3a of the substrate 3, and a thickness in the range 5-10 µm; a ohmic contact region 6 (for example of Nickel Silicide), which extends on the surface 3b of the substrate 3; a cathode metallization 16, which extends on the ohmic contact region 6; an anode metallization 8 which extends on a top surface 2a of the drift layer 2; multiple junction-barrier (JB) elements 9 in the drift layer 2, facing the top surface 2a of the drift layer 2 and each including a respective implanted region 9' of P-type and an ohmic contact 9" of metal material; and a region of edge termination, or protection ring, 10 (optional), for example, an implanted region of P-type, completely surrounding the junction-barrier (JB) elements 9.

Schottky diodes 12 are formed at the interface between the drift layer 2 and the anode metallization 8. In some embodiments, Schottky (semiconductor-metal) junctions are formed by portions of the drift layer 2 in direct electrical contact with respective portions of the anode metallization 8.

The region of the MPS device 1 including the JB elements 9 and the Schottky diodes 12 (i.e., the region contained within the protection ring 10) is an active area 4 of the MPS device 1.

Figure 2A:
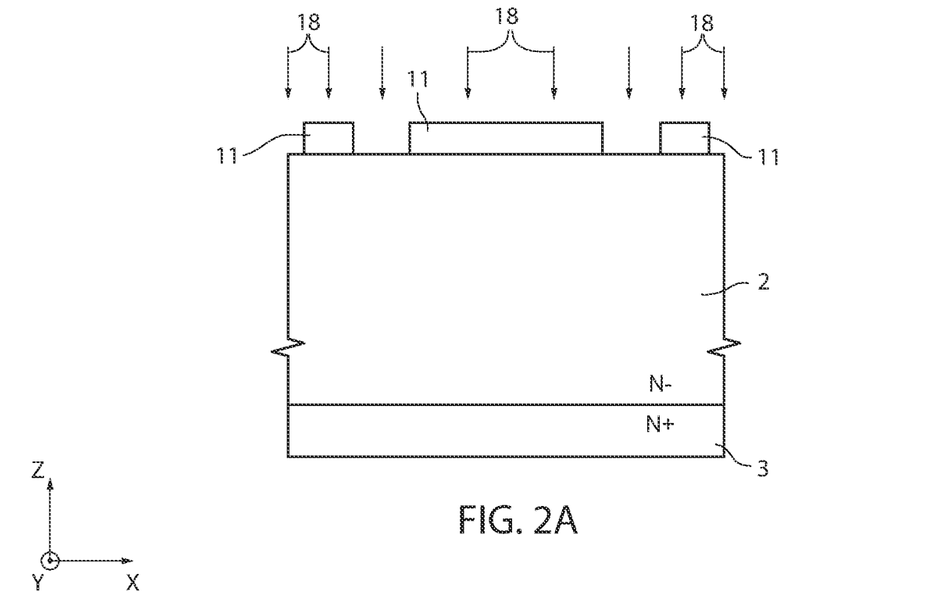
FIGS. 2A and 2B show, in cross-sectional view, intermediate manufacturing steps of the MPS device of FIG. 1, according to the prior art.
Figure 2B:
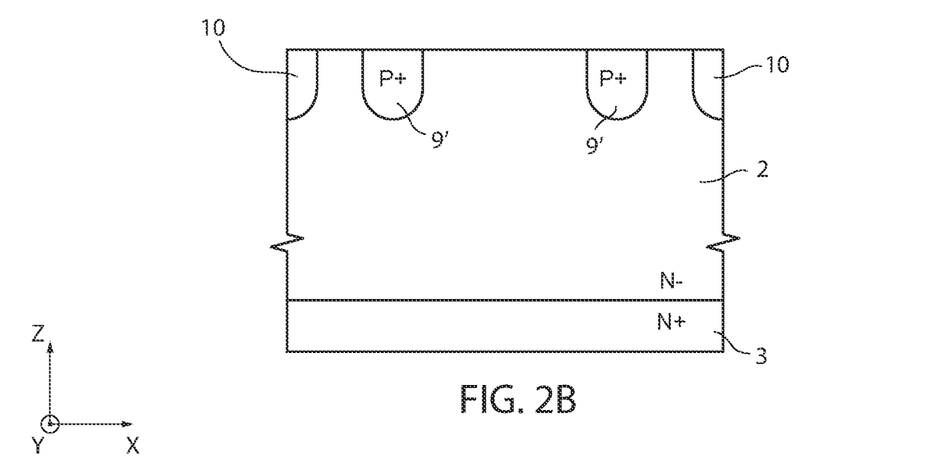

With reference to FIGS. 2A and 2B, the manufacturing steps of the MPS device 1 of FIG. 1 provide (FIG. 2A) a step of masked implant of doping species (for example, boron or aluminum), which have the second type of conductivity (P). The implant is illustrated with arrows 18 in FIG. 2A. A mask 11, for example, a hard mask of Silicon Oxide or TEOS, is used for the implant. Implanted regions 9' and the region of edge termination 10 are thus formed. Then, FIG. 2B, the mask 11 is removed and a thermal annealing step is performed for activating the doping species implanted in the step of FIG. 2A. The thermal annealing is, for example, performed at a temperature being higher than 1600° C. (for example, in the range 1700-1900° C. and in some cases even higher).

Figure 3A:
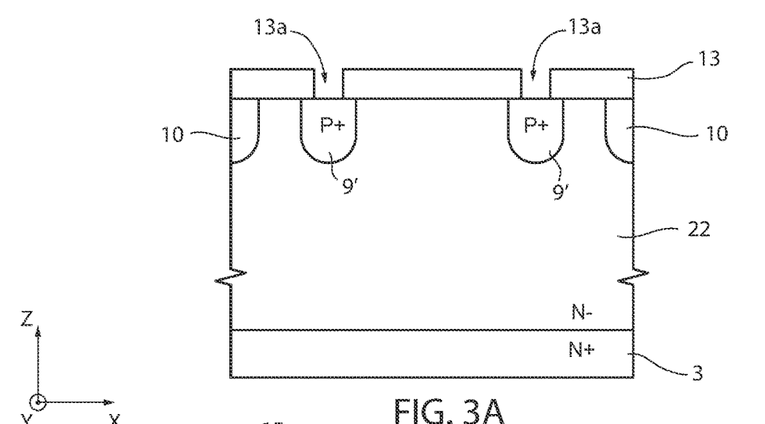
FIGS. 3A-3C show, in cross-sectional view, steps for forming ohmic contacts in the MPS device of FIG. 1, subsequently to the steps of FIGS. 2A and 2B, according to the prior art.
Figure 3B:
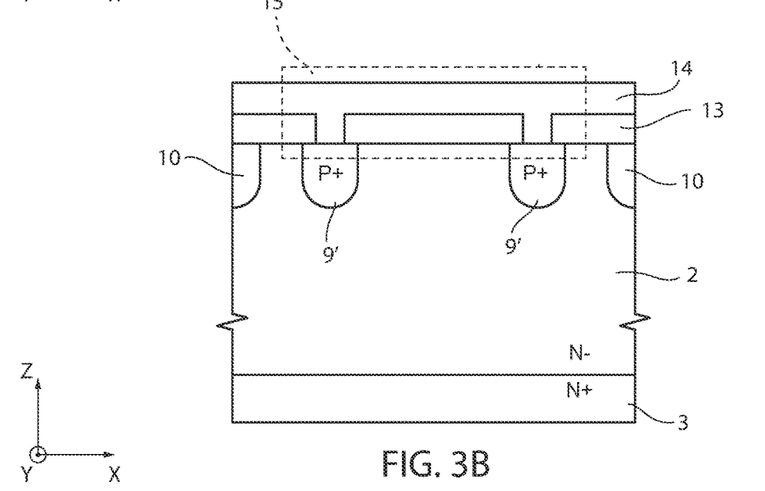
Figure 3C:
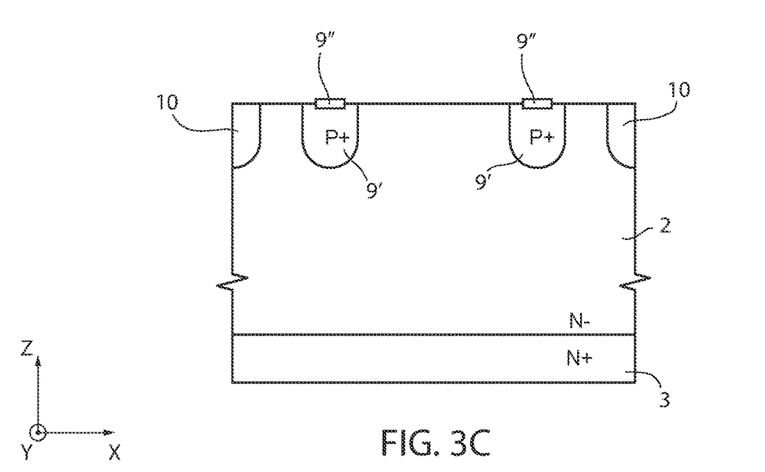

With reference to FIGS. 3A-3C, further steps are then performed for forming the ohmic contacts 9.". With reference to FIG. 3A, a deposition mask 13 of Silicon Oxide or TEOS is formed, to cover surface regions of the drift layer 2 other than the implanted regions 9' (and of the edge termination 10, if any). In other words, the mask 13 has through openings 13a at the implanted regions 9' (and optionally at at least one portion of the edge termination 10).

Then, FIG. 3B, a Nickel deposition is performed on the mask 13 and inside the through openings 13a (metal layer 14 in FIG. 3B). The Nickel thus deposited reaches and contacts the implanted regions 9' and the region of edge termination 10 through the through openings 13a.

With reference to FIG. 3C, a subsequent thermal annealing at high temperature (rapid thermal process, in the range 900° C.-1050° C. for a time interval from 1 minute to 120 minutes), allows ohmic contacts 9" of Nickel Silicide to be formed, by chemical reaction between the deposited Nickel and the Silicon of the drift layer 2 at the through openings 13a. In fact, the deposited Nickel reacts where it is in contact with the surface material of the drift layer 2, forming Ni2Si (i.e., the ohmic contact). Subsequently, a step of removing the metal which extends above the mask 13 and a removal of the mask 13 are performed.

Figure 4:
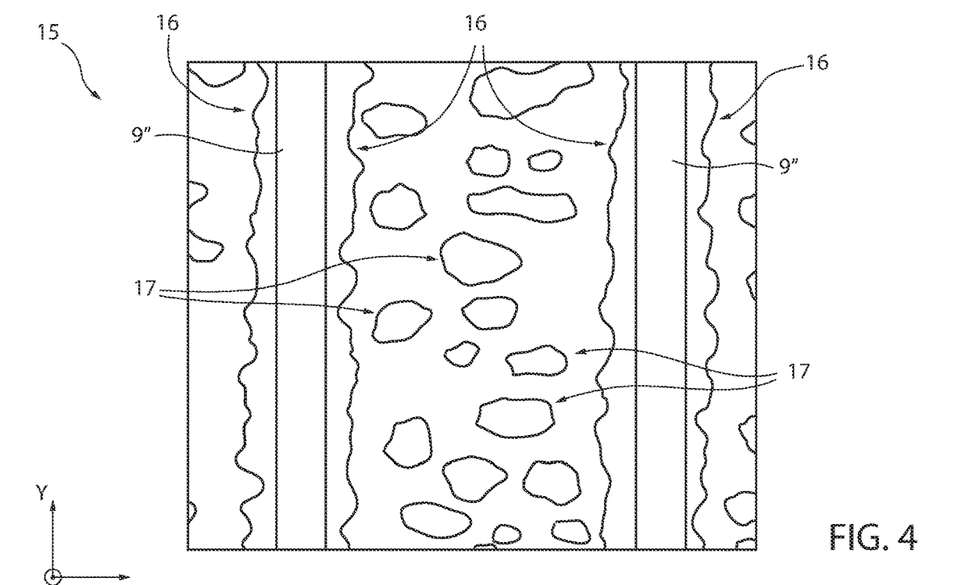
FIG. 4 illustrates, in plan view, unwanted regions formed as a consequence of the manufacturing steps of FIGS. 3A-3B, according to the prior art.

The inventors have verified that a reaction, albeit limited, still occurs between the Nickel of the metal layer 14 and the mask 13 where they are in direct contact, as illustrated in FIG. 4 as an example. FIG. 4 is a XY-plane top view, of a portion of the device of FIG. 3B, here the region delimited by a dashed line and identified with the reference number 15 in FIG. 3B. FIG. 4 refers to an intermediate manufacturing step between FIG. 3B and FIG. 3C, i.e., with the mask 13 still present, but with the layer 14 of Nickel removed. As is noted from FIG. 4, irregular regions, or islands, 17 extend on the mask 13 and are due to an unwanted reaction between the Nickel and the Silicon of the mask 13. The inventors have also noted that similar indented or jagged regions extend below the mask 13, i.e., on the surface 2a of the drift layer 2. In FIG. 4, these indented or jagged regions are identified with the reference number 16 and are of conductive material (including Nickel). If the extension on the XY-plane, for example along X axis, of these indented or jagged regions 16 were greater than the corresponding extension of the implanted regions 9', there would be a short circuit that would lead to the failure of the device. In detail, in case the unwanted conductive regions extended into the zone dedicated to the Schottky contact, an ohmic or quasi-ohmic contact (Schottky contact with low barrier) would be formed on an N-type zone (which, from the electrical point of view, is a resistance); there would therefore be a continuous current flow both in forward and reverse bias, losing the characteristics of a diode.

Figure 5:
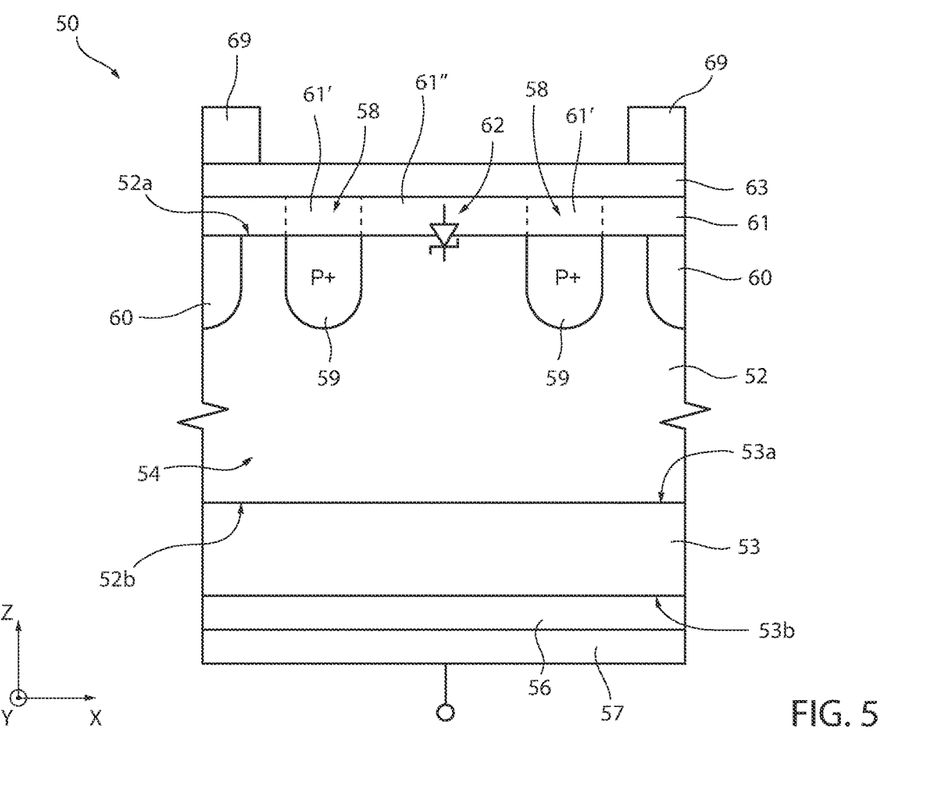
FIG. 5 shows, in cross-sectional view, a MPS device according to an embodiment of the present disclosure.

FIG. 5 shows, in lateral cross-section view in a Cartesian (triaxial) reference system of axes X, Y, Z, a Merged-PiN-Schottky (MPS) device 50 according to an aspect of the present disclosure.

The MPS device 50 includes a substrate 53, of a wide bandgap semiconductor material. In some embodiments, the substrate 53 includes N-type SiC, for example, 4H—SiC, having a first N+ dopant concentration, provided with a surface 53a opposite to a surface 53b, and a thickness in the range 50 µm-350 µm, and in some embodiments, in the range 160 µm-200 µm, and further in some embodiments, equal to 180 µm. In some embodiments, the substrate 53 may be of GaN.

An (epitaxially grown) drift layer 52, of N-type SiC (alternatively, of GaN), having a second N− dopant concentration being lower than the first dopant concentration, extends on the surface 53a of the substrate 53, and has a thickness in the range 5-15 µm. A region, or layer, of ohmic contact 56, for example of Nickel Silicide, extends on the surface 53b of the substrate 53. A bottom metallization 57, for example of Ti/NiV/Ag or Ti/NiV/Au, extends on the region of ohmic contact 56.

One or more doped regions 59 of P-type, hereinafter referred to as "junction barrier elements," or "JB elements," extend inside the drift layer 52, facing or adjacent to the top surface 52a of the drift layer 52. The figures illustrate two JB regions 59, by way of non-limiting illustrative example. Each JB element 59 is, as mentioned, an implanted region of P-type, in some embodiments, P+. Each JB element has a dopant concentration for example higher than $1 \cdot 10^{18}$ atoms/cm$^3$.

A region of edge termination, or protection ring, 60 (optional), in some embodiments, an implanted region of P-type (P+), externally delimits or surrounds the active area of the device.

According to an aspect of the present disclosure, a semiconductor layer 61, for example of MoS$_2$ (Molybdenum Sulfide, also known as Molybdenite, or Molybdenum Disulfide), extends on the top surface 52a of the drift layer 52. The semiconductor layer 61 is in electrical contact both with the JB elements 59 (e.g., in direct contact with the P+ implanted regions 59), and with portions of the top surface 52a of the drift layer 52 of N-type, laterally to the JB elements 59.

In general, the layer 61 is of a material pertaining to the group of transition metal chalcogenides, in some embodiments, dichalcogenides referred to as "Transition Metal Dichalcogenides," or "TMD", with semiconductor characteristics. TMDs are materials with chemical formula MX$_2$, where M is a transition metal of the group 4-10 (e.g., Mo, W, Nb, Ta, etc.) and X a chalcogen (e.g., S, Se, Te). A non-limiting list includes, in addition to the aforementioned MoS$_2$, MoSe$_2$, MoTe$_2$, WS$_2$, WSe$_2$, WTe$_2$ NbS$_2$. These materials have a typical layered structure, i.e., are formed by the stacking of different crystalline layers bonded to each other by weak Van der Waals-type bonds. Each crystalline layer is formed by transition metal atoms bonded to chalcogen atoms, according to the chemical formula MX$_2$, with strong covalent-type bonds. The symmetry of the single layers is hexagonal or rhombohedral, with atoms arranged in octahedral or trigonal prismatic coordination. A peculiar characteristic of the thin films of semiconductor TMDs, such as MoS$_2$, is that the width of the bandgap and the work function depend on the thickness (i.e., on the number of layers) that make up the stack. For example, a thin film made by a single MoS$_2$ layer (having a thickness of 0.65 nm) has a "direct" bandgap of 1.8-1.9 eV, while a film made by two or more MoS$_2$ layers has an "indirect" bandgap of 1.2 eV.

Furthermore, according to an aspect of the present disclosure, the material of the semiconductor layer 61 is chosen based on the material of the substrate 53 and the epitaxial layer 52. In some embodiments, the material of the semiconductor layer 61 is such that it shows a good lattice matching with the material of the epitaxial layer 52 whereon it is formed. For example, the inventors have verified that the use of MoS$_2$ on a substrate or epitaxial layer of SiC or GaN meets this requirement.

A top metallization 63 extends on the semiconductor layer 61 and in electrical contact with the semiconductor layer 61, for example, in direct electrical contact with the semiconductor layer 61.

A passivation layer 69 extends on the top metallization 63, at least partially protecting the latter. The passivation layer 69 has at least one opening having the top metallization 63 exposed therethrough, to enable electrical contact to the top metallization 63 from external, e.g., through wire bonding or other technology, to bias the device during use.

According to an aspect of the present disclosure, in order to form an ohmic contact at each JB element 59 and a Schottky contact laterally to the JB elements 59, e.g., at the surface regions of the drift layer 52 of N-type, the semiconductor layer 61 is selectively doped in order to selectively modify the conductivity thereof. In this regard, the semiconductor layer 61 has regions 61' with P-type conductivity at or adjacent to respective JB elements 59, and regions 61" with N-type conductivity at the surface portions of the drift layer 52 having N-type conductivity, which form respective Schottky diodes 62.

Along the direction of the X-axis, regions 61' and regions 61" are alternated to each other. Furthermore, each region 61' is adjacent, along X, to at least one respective region 61".

Each region 61', of P-type, extends vertically, e.g., along the Z-axis, throughout the thickness of the semiconductor layer 61, so as to electrically contact the respective JB element wherewith it is (at least in part) vertically aligned. Similarly, each region 61" extends vertically, e.g., along the Z-axis, throughout the thickness of the semiconductor layer 61, so as to electrically contact a respective surface region of the layer 52 of N-type.

Each region 61' forms, with the respective JB element wherewith it is in electrical contact, a respective junction barrier diode 58; similarly, each region 61" forms, with the respective surface portion of the layer 52 wherewith it is in electrical contact, the respective Schottky diode 62.

The region of the MPS device 50 that includes the JB diodes 58 and the Schottky diodes 62, e.g., the region contained within the protection ring 60, is the active area of the MPS device 50.

The inventors have verified that the work function of the $MoS_2$ material may be varied or modified or tuned through a suitable functionalization of $MoS_2$, for example, a functionalization for modifying the conductivity properties (N-type or P-type) of $MoS_2$. Furthermore, alternatively or additionally to what has been said above, the work function of the $MoS_2$ material may be varied or modified or tuned by selecting a suitable number of superimposed $MoS_2$ layers. For example, in the context of the present disclosure, the "semiconductor layer 61" may be a single $MoS_2$ layer, e.g., a monolayer having a two-dimensional structure, or a $MoS_2$ multi-layer, e.g., having a three-dimensional structure.

For example, the work function of a $MoS_2$ multi-layer may be tuned, e.g., between 4.4 eV and 5.6 eV, through a suitable doping through Oxygen (02), which is for generating a P-type conductivity of the sole doped regions.

As a further example, the work function of a single $MoS_2$ layer may be tuned, e.g., between 4.1 eV and 6 eV, through a suitable doping through Oxygen (02), which is for generating a P-type conductivity of the sole doped regions.

In the context of the present disclosure, the term "semiconductor layer 61" includes both a multi-layer and a monolayer.

By selectively varying the conductivity of the $MoS_2$ layer 61 and/or the number of sub-layers making it (multi-layer or monolayer) the potential barrier of the $MoS_2$ layer 61 may therefore be modified.

For example, in the case of N-type doped $MoS_2$, forming a Schottky contact with an N-type 4H—SiC substrate, the barrier height is about 1.3 eV in the multi-layer case, and about 1 eV in the single-layer case.

For example, in the case of P-type doped $MoS_2$, forming an ohmic contact with a P+ implanted region in the N-type 4H—SiC substrate, the barrier height is about 0.6 eV in the multi-layer case, and about 0.2 eV in the single-layer case.

The manufacturing steps of the MPS device 50 are described with reference to FIGS. 6A-6D.

Figure 6A:
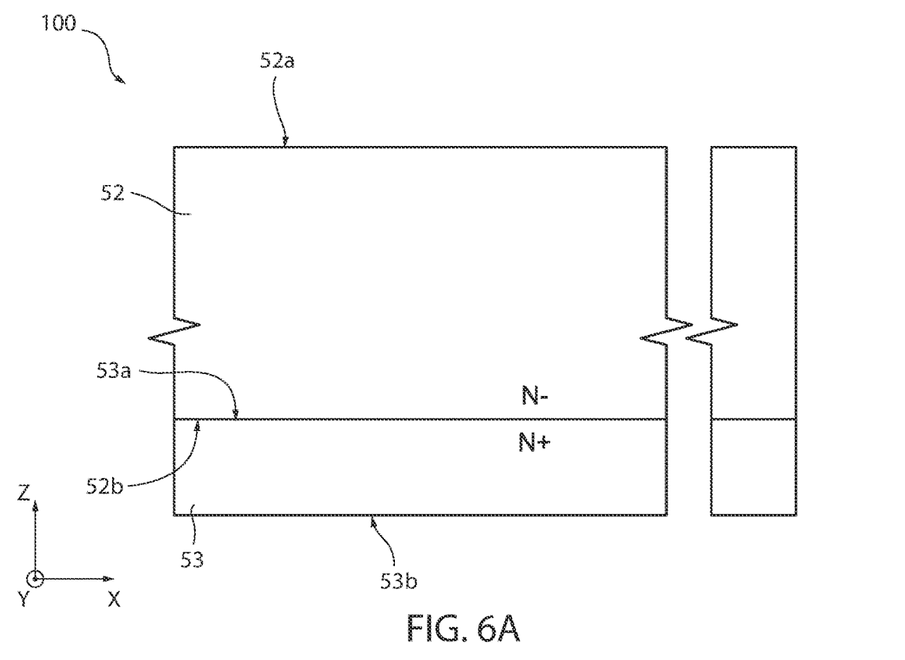
FIGS. 6A-6D illustrate, in cross-sectional view, manufacturing steps of the MPS device of FIG. 5, according to the present disclosure.

Referring to FIG. 6A, a wafer 100 is arranged, including the substrate 53 of SiC, for example, 4H—SiC, however other polytypes may be used. As mentioned, other materials may also be used, for example GaN.

The substrate 53 has a first type of conductivity, in some example embodiment a dopant of an N-type, and is provided with the front surface 53a and the rear surface 53b, which are opposite to each other along the Z-axis. The substrate 53 has an N+ dopant concentration in the range, e.g., $1\cdot10^{19}$-$1\cdot10^{20}$ atoms/cm$^3$.

The front of the wafer 100 corresponds to the front surface 53a, and the back of the wafer 100 corresponds to the rear surface 53b.

The drift layer 52, of Silicon Carbide having electrical conductivity N and having a N− dopant concentration being lower than that of the substrate 53, e.g., in the range $1\cdot10^{14}$-$5\cdot10^{16}$ atoms/cm$^3$, is formed, for example by epitaxial growth, on the front surface 53a of the substrate 53. The drift layer 52 is made of SiC, for example 4H—SiC, but other SiC polytypes or, alternatively, GaN may be used.

The drift layer 52 extends, throughout its thickness, between the top side 52a and the bottom side 52b, the latter of which in direct contact with the front surface 53a of the substrate 53.

Figure 6B:
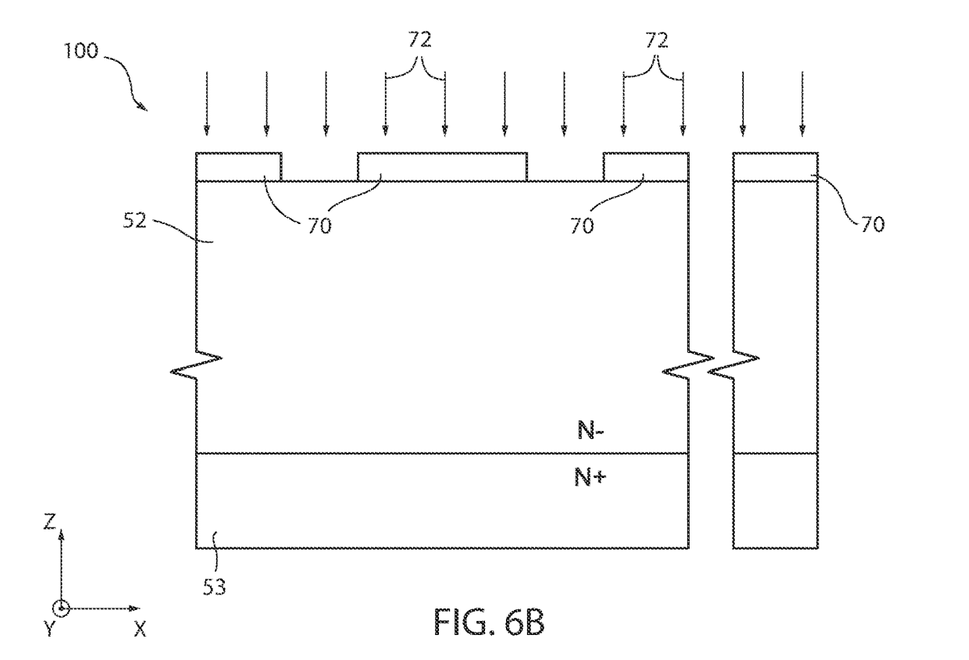

Then, FIG. 6B, a hard mask 70 is formed on the top side 52a of the drift layer 52, for example by depositing a photoresist, or tetraethoxysilane (TEOS), or another material suitable for the purpose. The hard mask 70 has a thickness in the range 0.5 μm-2 μm or in any case a thickness such that it shields the implant described hereinafter with reference to the same FIG. 6B. The hard mask 70 extends into a region of the wafer 100 wherein, in subsequent steps, the active area 54 of the MPS device 50 will be formed.

In plan view, on the XY-plane, the hard mask 70 covers the regions of the top side 52a of the drift layer 52 which will form Schottky cells (diodes 62) and leaves exposed the regions of the top side 52a of the drift layer 52 that will form the implanted regions 59, already described with reference to FIG. 5.

A step of implanting doping species, for example, boron or aluminum, which have the second type of conductivity, here, for example P type, is then performed, exploiting the hard mask 70 (the implant is indicated in the figure by the arrows 72). During the step of FIG. 6B, the protection ring 60, if any, is also formed.

In an example embodiment, the implant step of FIG. 6B comprises one or more implants of doping species, which have the second type of conductivity, with implant energy in the range 30 keV-400 keV and with doses in the range $1\cdot10^{12}$ atoms/cm$^2$-$1\cdot10^{15}$ atoms/cm$^2$, to form the implanted regions 59 with a dopant concentration being greater than $1\cdot10^{18}$ atoms/cm$^3$. Implanted regions are thus formed having a depth, measured from the surface 52a, in the range 0.4 μm-1 μm.

Figure 6C:
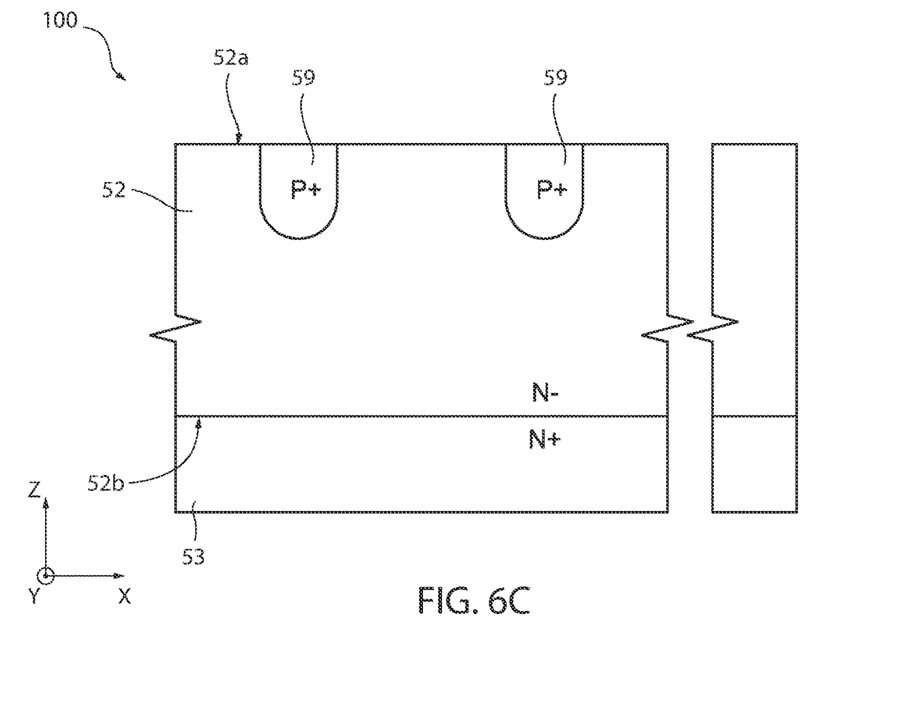
Figure 6D:
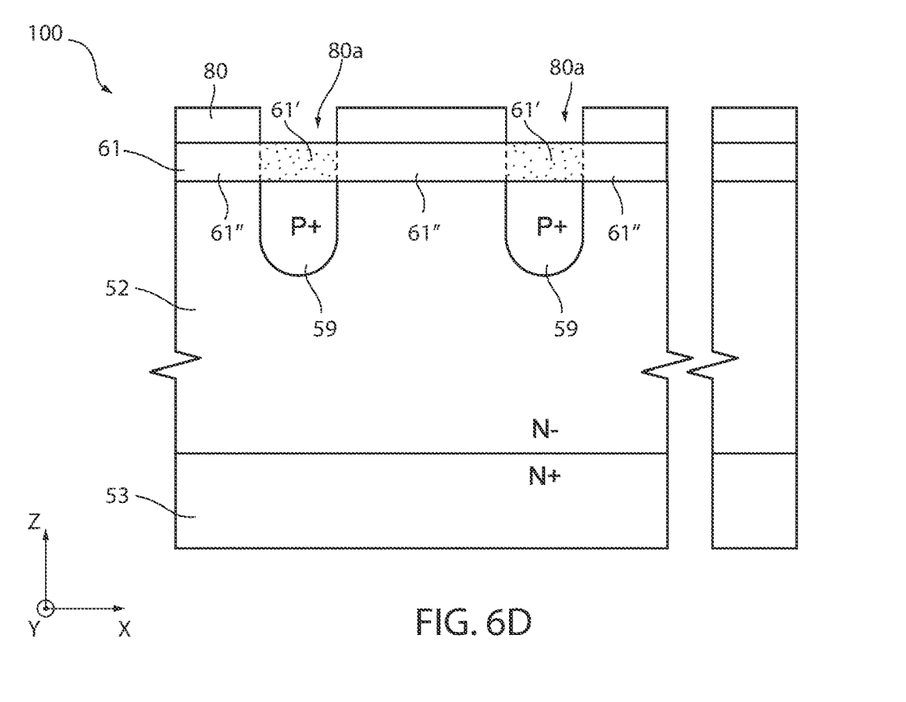

Subsequently, FIG. 6C, the mask 70 is removed and, FIG. 6D, the semiconductor layer 61, for example of $MoS_2$, is formed.

An example process is now described for the formation of the semiconductor layer 61, by CVD ("Chemical Vapor Deposition") deposition of $MoS_2$ on the epitaxial layer 52, which in this example is of SiC. This process is described with reference to FIGS. 7A-7C, wherein a dual zone reactor 90, including a quartz tubular body and formed by two regions 90a, 90b that can be heated independently of each other, is schematically illustrated.

Figure 7A:
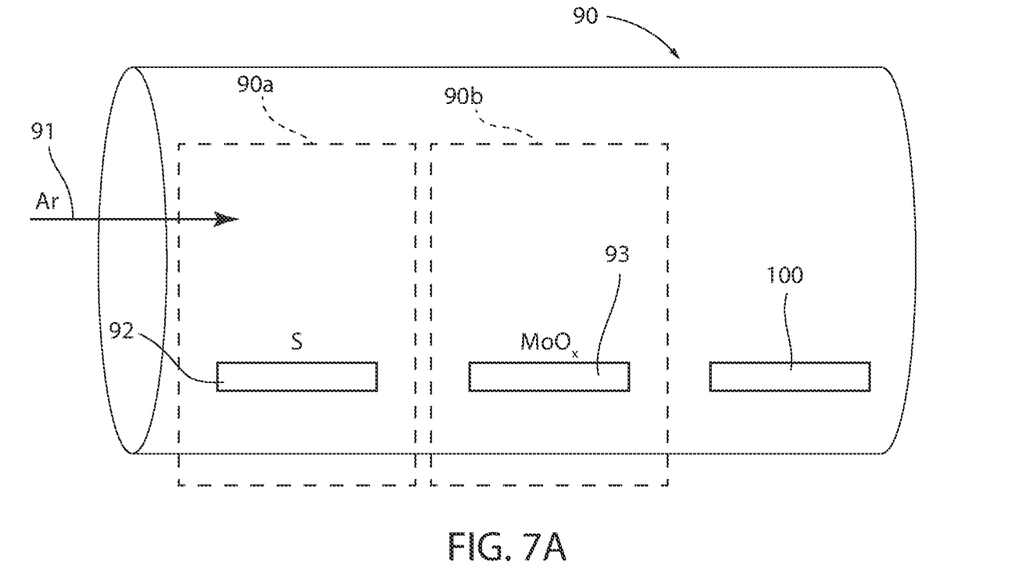
FIGS. 7A-7D illustrate steps of forming a $MoS_2$ semiconductor layer, usable in the context of the manufacturing steps of FIG. 6D.

With reference to FIG. 7A, Sulfur (S) and Molybdenum (Mo, or $MoO_x$, e.g., with x=3) are used as precursors for growing MoS$_2$. The Sulfur precursor (e.g., in the form of powder) is arranged in the region 90a, in a crucible 92, at a distance from the wafer whereon the growth of MoS$_2$ is to be performed (at a distance of about 7-15 cm). The Molybdenum precursor (also, for example, in the form of powder) is arranged in a respective crucible 93 in the region 90b in proximity to the wafer 100 whereon the growth of MoS$_2$ is to be performed (i.e., in the region 90b, between the wafer 100 and the Sulfur crucible).

Figure 7B:
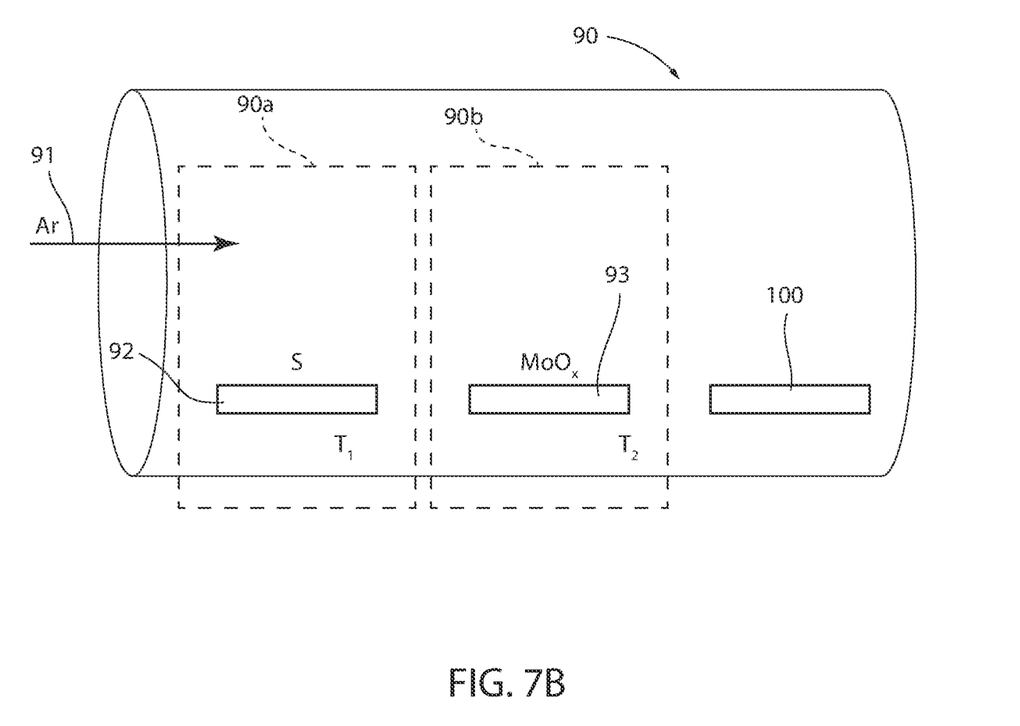

With reference to FIG. 7B, the region 90a is heated to a temperature T1 in the range 100-200° C., for example in the range 150-160° C., causing the evaporation of the Sulfur which deposits on the wafer 100. The region 90b is heated to a temperature T2 being higher than temperature T1, in then range 700-800° C., causing the evaporation of the Molybdenum which deposits on the wafer 100.

Figure 7C:
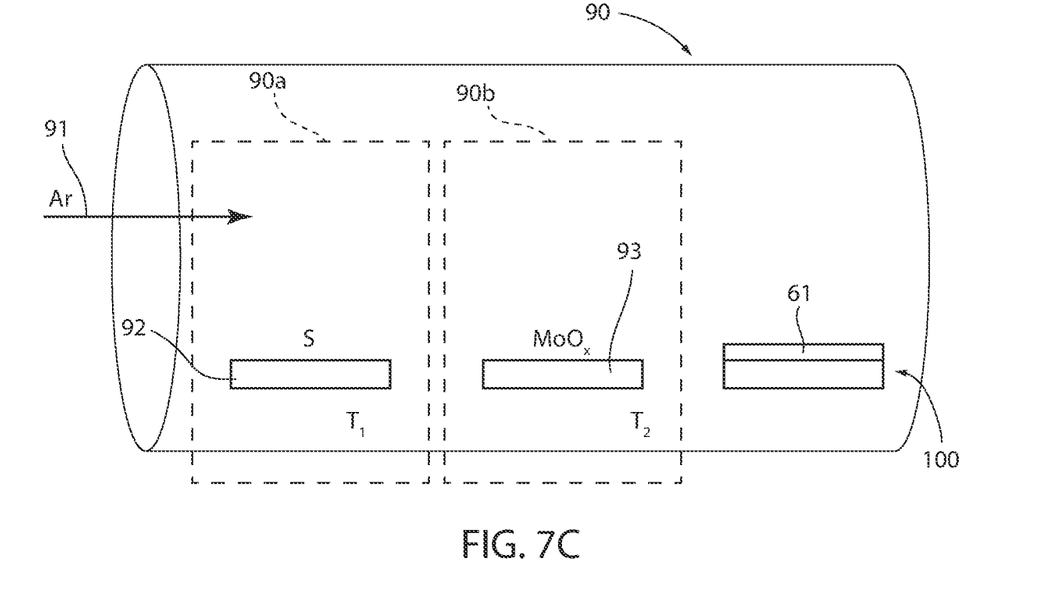

This process occurs in the presence of a carrier gas introduced into the reactor 90 with the direction indicated by the arrow 91 in FIGS. 7A-7C. The gas is for example Argon (Ar), introduced at about 100 sccm. The direction of the gas is such that the sulfur and Molybdenum vapors are pushed towards the wafer 100.

At the level of the wafer 100, FIG. 7C, Sulfur and Molybdenum deposit thereon, forming the MoS$_2$ layer 61 by chemical reaction.

The number of MoS$_2$ sub-layers (single-layer or multi-layer) that are formed during the reaction of the Sulfur and Molybdenum vapors on the wafer 100 may be controlled by adjusting one or more of: temperature T2, time duration of the growth process and flow of Sulfur vapors (by adjusting the flow of carrier gas).

Alternatively or additionally, an MoS$_2$ multi-layer may be deposited and then, through etching techniques, one or more layers may be selectively removed, up to reducing this multi-layer to a single-layer/monolayer.

Figure 7D:
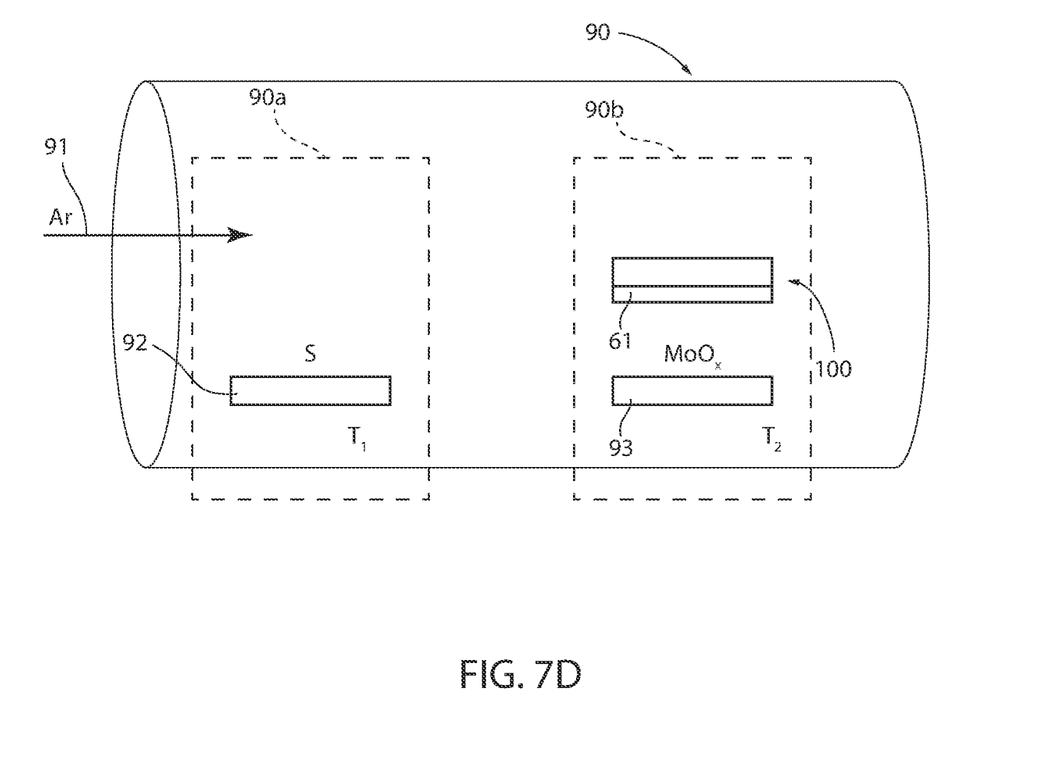

Other relative arrangements of the crucibles 92, 93 and the wafer 100 in the reactor 90 are possible. For example, FIG. 7D, the crucible 93 may be arranged below the wafer 100. In this case, the wafer 100 is oriented with the top face (whereon the layer 61 is to be formed) towards the crucible 93.

Other techniques or methods may be used in the context of the present disclosure for the formation of the semiconductor layer 61. Such methods (known in literature) are both of bottom-up and top-down type, and include: Atomic Layer Deposition (ALD), Pulsed Laser Deposition (PLD), sputtering.

The semiconductor layer 61 thus formed shows an N-type conductivity in the absence of a further doping, which is still possible in case the concentration of majority conductive species is to be further adjusted.

Returning to FIG. 6D, a mask 80 (for example of photoresist) which has openings 80a at the regions of the semiconductor layer 61 which need to be functionalized is formed on the semiconductor layer 61, to modify the conductivity thereof. Surface regions 61a of the semiconductor layer 61 are exposed through the openings 80a in the photoresist. These openings 80a are, at least in part, aligned (along the Z-axis, or in XY-plane top view) with respective JB elements 59.

The wafer 100, provided with the mask 80, is arranged in a reactor wherein an oxygen plasma is generated for the functionalization of the semiconductor layer 61. The oxygen reacts with the material of the semiconductor layer 61 exposed through the openings 80a, providing a selective P-type doping. The doped regions 61' (of P-type), described with reference to FIG. 5 and, contextually, the regions 61" (of N-type) are thus formed.

The functionalization of MoS$_2$ to form the P-type regions 61' occurs for example through plasma treatment, and may be performed using various chemical species (including O$_2$, CHF$_3$, CF$_4$, and SF$_6$.

The electrical conductivity of the regions 61" of the semiconductor layer 61 covered by the mask 80 is not altered by the functionalization step through O$_2$; these regions therefore maintain the N-type conductivity.

The mask 80 may then be removed.

The manufacturing steps then proceed, in a manner not illustrated in the figures, with the formation of the top metallization and of the passivation layer, in a per se known manner and therefore not further described or illustrated in the figures. The formation of the ohmic contact on the back of the wafer, and of the bottom metallization, are also known per se and therefore not further described.

From an examination of the characteristics of the disclosure provided according to the present description, the advantages that it affords are evident.

In some embodiments, the "IFSM ruggedness" value of a SiC MPS diode is maximized, the manufacturing flow is simplified, and the problems described with reference to the prior art, relating to protrusions or Nickel residues are avoided and overcome.

Finally, it is clear that modifications and variations may be made to what has been described and illustrated herein, without thereby departing from the scope of the present disclosure, as defined in the attached claims.

A method of manufacturing a Merged-PiN-Schottky, MPS, device (50) may be summarized as including the steps of implanting, at a front side (52a) of a solid body (52, 53) having a first electrical conductivity (N), doping species having a second electrical conductivity (P) opposite to the first electrical conductivity (N), thus forming an implanted region (59) which extends into the solid body from the front side (52a); forming, on the front side (52a), a semiconductor layer (61) of a material which is a transition metal dichalcogenide, TMD, having the first electrical conductivity (N); selectively functionalizing a first region (61') of the semiconductor layer (61) through chemical species for generating, in said first region, the second electrical conductivity (P), said first region being in electrical contact with the implanted region (59), and being adjacent to a second region of the semiconductor layer (61) having the first electrical conductivity (N) which is in electrical contact with a respective surface portion of the front side (52a) having the first electrical conductivity (N).

The first region (61') may extend throughout the thickness of the semiconductor layer (61), reaching the front side (52a) of the solid body (52, 53) at least partially at the implanted region (59).

Functionalizing the first region (61') may include forming an ohmic contact at the interface between the solid body (52, 53) and the implanted region (59).

Forming the ohmic contact may include forming a junction barrier, JB, diode.

The step of forming the semiconductor layer (61) may include forming a Schottky diode at the interface between the second region (61") and the solid body, laterally to the implanted region (59).

The material of the solid body (52, 53) may be one of: SiC, 4H—SiC, GaN, diamond, Ga$_2$O$_3$.

The material of the semiconductor layer (61) may be one of MoS$_2$, MoSe$_2$, MoTe$_2$, WS$_2$, WSe$_2$, WTe$_2$.

The method may further include the steps of forming, on the semiconductor layer (61), a first electrical terminal common to said JB diode and to said Schottky diode including a first metal layer; and forming, at a rear side (53b) opposite to the front side (52a) of the solid body, a second electrical terminal (57) common to said JB diode and to said Schottky diode including a second metal layer.

The method may further include the steps of arranging a substrate (53); epitaxially growing, on the substrate (53), an epitaxial layer (52) which forms a drift layer of the MPS device (50), wherein the substrate (53) and epitaxial layer (52) form, together, said solid body.

The step of forming the semiconductor layer (61) may include performing a CVD growth process, or an ALD process, or a sputtering process, or a PLD process.

The first electrical conductivity may be of N-type, the second electrical conductivity may be of P-type, and the step of functionalizing the first region (61') may include doping the first region (61') through $O_2$.

A Merged-PiN-Schottky, MPS, device (50) may be summarized as including a solid body (52, 53) having a first electrical conductivity (N); an implanted region (59) extending into the solid body (52, 53) facing a front side (52a) of the solid body (52, 53), having a second electrical conductivity (P) opposite to the first electrical conductivity (N); and a semiconductor layer (61) extending on the front side (52a), of a material which is a transition metal dichalcogenide, TMD, wherein a first region (61') of the semiconductor layer (61) has the second electrical conductivity (P) and extends in electrical contact with the implanted region (59), and a second region (61") of the semiconductor layer (61) has the first electrical conductivity (N) and extends adjacent to the first region (61') and in electrical contact with a respective surface portion of the front side (52a) having the first electrical conductivity (N).

The first region (61') may extend throughout the thickness of the semiconductor layer (61), reaching the front side (52a) of the solid body (52, 53) at least partially at the implanted region (59).

The first region (61') may form an ohmic contact with the implanted region (59). At the first region (61') the semiconductor layer (61) may form, with the implanted region (59), a junction barrier, JB, diode.

At the second region (61") the semiconductor layer (61) may form, with the solid body (52, 53), a Schottky diode.

The material of the solid body (52, 53) may be one of: SiC, 4H—SiC, GaN, diamond, $Ga_2O_3$.

The material of the semiconductor layer (61) may be one of $MoS_2$, $MoSe_2$, $MoTe_2$, $WS_2$, $WSe_2$, $WTe_2$.

The device may further include a first electrical terminal common to said JB diode and to said Schottky diode, may include a first metal layer on the semiconductor layer (61); and a second electrical terminal (57) common to said JB diode and to said Schottky diode, may include a second metal layer at a rear side (53b) opposite to the front side (52a) of the solid body.

The solid body may include a substrate (53); and an epitaxial layer (52) on the substrate (53), wherein the epitaxial layer (52) may be a drift layer of the MPS device (50).

The first electrical conductivity may be of N-type, and the second electrical conductivity may be of P-type.

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   implanting, at a front side of a solid body having a first type of electrical conductivity, doping species having a second type of electrical conductivity opposite to the first type of electrical conductivity, thereby forming an implanted region which extends into the solid body from the front side;
   forming, on the front side, a semiconductor layer of a transition metal dichalcogenide (TMD) material, the semiconductor layer having the first type of electrical conductivity;
   selectively functionalizing a first region of the semiconductor layer through doping species thereby generating, in said first region, the second type of electrical conductivity, the first region being in electrical contact with the implanted region, and being laterally adjacent to a second region of the semiconductor layer having the first type of electrical conductivity, the second region in electrical contact with a respective surface portion of the front side having the first type of electrical conductivity.

2. The method according to claim 1, wherein the first region extends throughout a thickness of the semiconductor layer, reaching the front side of the solid body, and at least partially overlapping the implanted region.

3. The method according to claim 1, wherein the functionalizing the first region includes forming an ohmic contact at an interface between the implanted region and the first region.

4. The method according to claim 3, wherein the forming the ohmic contact includes forming a junction barrier (JB) diode.

5. The method according to claim 4, wherein the forming the semiconductor layer includes forming a Schottky diode at an interface between the second region and the solid body, laterally to the implanted region.

6. The method according to claim 1, wherein a material of the solid body is one of: SiC, 4H—SiC, GaN, AlN, diamond, or $Ga_2O_3$.

7. The method according to claim 1, wherein a material of the semiconductor layer is one or more of $MoS_2$, $MoSe_2$, $MoTe_2$, $WS_2$, $WSe_2$, or $WTe_2$.

8. The method according to claim 5, further comprising:
   forming, on the semiconductor layer, a first electrical terminal common to the JB diode and to the Schottky diode; and
   forming, at a rear side opposite to the front side of the solid body, a second electrical terminal common to the JB diode and to the Schottky diode.

9. The method according to claim 1, further comprising:
   arranging a substrate;
   epitaxially growing, on the substrate, an epitaxial layer, wherein the substrate and epitaxial layer together form the solid body.

10. The method according to claim 1, wherein the forming the semiconductor layer comprises performing a CVD growth process, an ALD process, a sputtering process, or a PLD process.

11. The method according to claim 1, wherein the first type of electrical conductivity is N-type, the second type of electrical conductivity is P-type, and the functionalizing the first region comprises doping the first region using $O_2$.

12. A Merged-PiN-Schottky device, comprising:
a solid body having a first type of electrical conductivity;
an implanted region extending into the solid body from a front side of the solid body, the implanted region having a second type of electrical conductivity different from the first type of electrical conductivity; and
a semiconductor layer on the front side of the solid body, the semiconductor layer having a transition metal dichalcogenide (TMD) material,
wherein a first region of the semiconductor layer has the second type of electrical conductivity and in electrical contact with the implanted region, and a second region of the semiconductor layer has the first type of electrical conductivity and is adjacent to the first region and in electrical contact with a respective surface portion of the front side that has the first type of electrical conductivity.

13. The device according to claim 12, wherein the first region extends throughout the thickness of the semiconductor layer, reaches the front side of the solid body, and at least partially overlaps the implanted region.

14. The device according to claim 12, wherein the first region forms an ohmic contact with the implanted region.

15. The device according to claim 14, wherein the first region of the semiconductor layer forms, with the implanted region, a junction barrier (JB) diode.

16. The device according to claim 15, wherein the second region of the semiconductor layer forms, with the solid body, a Schottky diode.

17. The device according to claim 16, further comprising:
a first electrical terminal common to the JB diode and to the Schottky diode, on the semiconductor layer; and
a second electrical terminal common to the JB diode and to the Schottky diode, on a rear side opposite to the front side of the solid body.

18. The device according to claim 12, wherein a material of the solid body is one of: SiC, 4H—SiC, GaN, AlN, diamond, $Ga_2O_3$.

19. The device according to claim 12, wherein a material of the semiconductor layer is one or more of $MoS_2$, $MoSe_2$, $MoTe_2$, $WS_2$, $WSe_2$, or $WTe_2$.

20. A structure, comprising: a substrate; an epitaxial layer of a wide bandgap semiconductor material on the substrate, the epitaxial layer having a first type of conductivity; a first doped region in the epitaxial layer and adjacent to a surface of the epitaxial layer distal to the substrate, the doped region having a second type of conductivity; and a semiconductor layer of a transition metal dichalcogenide (TMD) material on the epitaxial layer, the semiconductor layer including a second doped region extending through a thickness of the semiconductor layer and overlapping the first doped region, the second doped region having the second type of conductivity.

21. The structure of claim 20, further comprising a third doped region in the epitaxial layer, the third doped region laterally surrounding the first doped region.

* * * * *